United States Patent
Capodivacca et al.

(10) Patent No.: US 7,301,376 B2
(45) Date of Patent: Nov. 27, 2007

(54) CONTROL CIRCUIT AND METHOD FOR DRIVING A HALF-BRIDGE CIRCUIT

(75) Inventors: Giovanni Capodivacca, Padua (IT); Nicola Florio, Bari (IT); Maurizio Galvano, Raffadali (IT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/411,199

(22) Filed: Apr. 25, 2006

(65) Prior Publication Data

US 2007/0069236 A1    Mar. 29, 2007

(30) Foreign Application Priority Data

Sep. 29, 2005 (EP) ................. 05021303

(51) Int. Cl.
*H03B 1/00* (2006.01)
(52) U.S. Cl. .................. 327/112; 327/73
(58) Field of Classification Search .......... 327/72, 327/73, 77, 84, 87, 111, 112
See application file for complete search history.

(56) References Cited

U.S. PATENT DOCUMENTS

| | | | |
|---|---|---|---|
| 5,408,150 A | | 4/1995 | Wilcox |
| 5,959,475 A | * | 9/1999 | Zomorrodi ............ 327/112 |
| 6,353,345 B1 | | 3/2002 | Yushan et al. |
| 6,828,833 B1 | * | 12/2004 | Guebels ............... 327/112 |
| 2005/0122754 A1 | | 6/2005 | Nielsen |

FOREIGN PATENT DOCUMENTS

DE   101 47 882 A1   4/2003
WO   WO 02/095914 A2   11/2002

OTHER PUBLICATIONS

"High-Efficiency Predictive Synchronous Buck Driver with Enable." Data Sheet UCC27223, Texas Instruments Incorporated. Dec. 2003: pp. 1-30. (30 Pgs).

* cited by examiner

*Primary Examiner*—Jeffrey Zweizig
(74) *Attorney, Agent, or Firm*—Maginot, Moore & Beck (57) ABSTRACT

A method is disclosed for controlling a first transistor in a half-bridge circuit which also includes a second transistor. The transistors can be controlled by applying drive voltages to their gates. During a switch-off operation of the second transistor, the amplitude of the drive voltage of the second transistor is compared with a first threshold value and a second threshold value. A switch-on operation for the first transistor is started following a specified first period which begins at a first time when the drive voltage of the second transistor undershoots the first threshold value. The first threshold value is set in accordance with a second period which begins at a second time when the amplitude of the drive voltage of the second transistor undershoots the second threshold value. The second period ends at another time when the first transistor adopts a specified initial operating state during the switch-on operation.

21 Claims, 6 Drawing Sheets

CONTROL CIRCUIT AND METHOD FOR DRIVING A HALF-BRIDGE CIRCUIT

TECHNICAL FIELD

This invention refers to a method for driving a half-bridge circuit comprising two transistors, and a control circuit for a half-bridge circuit.

BACKGROUND

Figure 1:
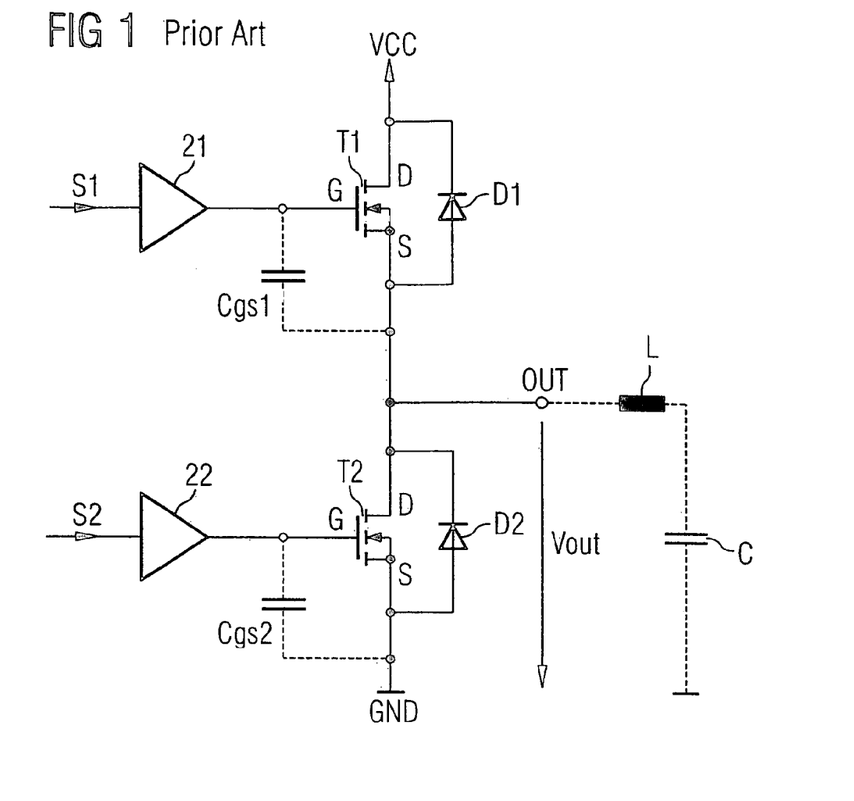
FIG. 1 illustrates a prior art half-bridge circuit with a first and second transistor whose load paths are connected in series.

FIG. 1 illustrates a half-bridge circuit with two transistors T1 and T2, each of which has a load path D-8 and a control gate G. The transistors T1 and T2 are implemented in the example as n-channel MOSFETs, whose drain-source paths D-8 form the load paths and whose gate terminals form the control terminals. A node that is shared by the load paths in the transistors T1 and T2 constitutes an output OUT of the half-bridge circuit. The half-bridge circuit with the two transistors T1 and T2 is used to control a load connected to the output terminal OUT, as shown in FIG. 1 by a dashed line, and which is implemented as an LC circuit, for example.

The transistors T1 and T2 are driven in accordance with the first and second control signals S1 and S2, which are generated by a control circuit that is not described here, and which are converted by means of driver stages 21 and 22 to suitable drive voltages Vgs1 and Vgs2 for driving the MOSFETs T1 and T2. These drive voltages are the gate-source voltages for the transistors T1 and T2 designed as MOSFETs.

The load paths of the transistors T1 and T2 are connected in series between a terminal for first power supply potential or—positive supply potential VCC and a terminal for negative supply potential or reference potential GND. To prevent cross current between the terminals for the positive supply potential VCC and reference potential GND, the first and second transistors T1 and T2 must be driven in such a way that the two transistors T1 and T2 are not operating in the conducting state together at any time. Note here that the transistors T1 and T2 react in a delayed manner to changes in level of the control signals S1 and S2 by changing their current switching state. This is mainly due to the fact that internal gate-source capacitors Cgs1 and Cgs2 (displayed by dashed lines) of the MOSFETs T1 and T2 must first be charged from a switch-off level to a switch-on level after a change in level of the corresponding control signal until the corresponding MOSFET T1 or T2 actually conducts, and that internal gate-source capacitors Cgs1 and Cgs2 must be discharged from a switch-on level to a switch-off level after a change in level of the control signal until the corresponding MOSFET actually blocks.

A known method of preventing cross currents is to prevent generating a switch-on level for a control signal until after a delay has elapsed after the other control signal has reached a switch-off level. This is illustrated in FIG. 2.

Figure 2:
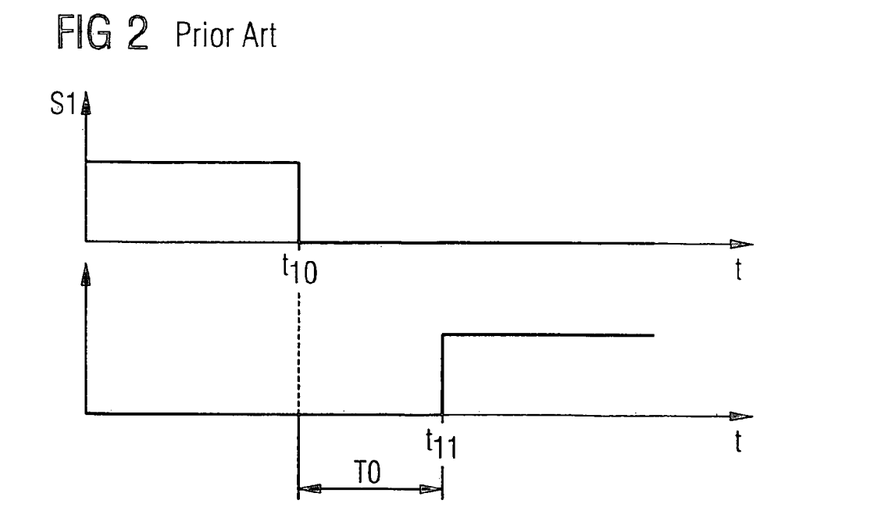
FIG. 2 shows an example of the timing of the first and second control signals for the first and second transistors in the half-bridge circuit using a prior art method.

FIG. 2 gives an example of the timing of the first control signal S1 for the first transistor T1. The control signal S1 is a dual-value signal that can reach switch-on and switch-off levels. The switch-on level is the level of the signal at which the first transistor T1 is to be driven as conducting, while the switch-off level is the level of the signal at which the first transistor T1 is to be driven as blocking. This first control signal S1 switches at a time t10 from the switch-on level to the switch-off level. The switch-on level of the second control signal S2 occurs at a time t11 after a delay T0 after the time t10. The delay T0 must be selected so that the transistor T1 driven by the first control signal S1 is certain to be switched off—i.e., operates in the blocking state, within the delay period T0.

In order to be sure of avoiding cross currents, the delay T0 could be configured to be very long. However, using the half-bridge circuit to control an inductive load as illustrated in FIG. 1 has the disadvantage that during the period in which the first transistor T1 is already blocking, but the second transistor T2 has not yet been driven to conducting mode, a body diode integrated into the second MOSFET T2 (the diode marked with the reference D2 in FIG. 1) adopts a free-wheeling current of the inductive load L. Greater losses occur here in comparison with the operating case in which the second transistor T2 is conducting and receiving the free-wheeling current. Considerable power losses may result in this way in the event of high switching frequencies. To minimize such losses, the period during which the two transistors T1 and T2 are blocking at the same time should be as short as possible.

A proposal can be found in DE 101 47 882 A1 to prevent cross currents by monitoring the switching states of two transistors of a half-bridge circuit by determining the relevant driving currents and not driving one of the two transistors into the conducting state until it has been ascertained that the second transistor is in a blocking state.

The switching state of a MOSFET can also be determined by monitoring its gate-source voltage. However, this can have the problem in the case of power MOSFETs accommodated in a chip housing that the voltage on the outside of the housing can differ from the actual drive voltage in the component. It could therefore be the case that the MOSFET is still conducting although the voltage detected on the outside indicates that the component is in a blocking state.

Data sheet UCC 27223, Texas Instruments, December 2003, discloses a driver circuit for driving a half bridge including a low-side MOSFET and a high-side MOSFET in a buck converter. The driver circuit is adapted to detect body-diode conduction of the low-side MOSFET and is adapted to minimize the dead time, i.e. the time when both MOSFETs are blocking, based on the body-diode conduction time.

Accordingly, it would be advantageous to provide a method of driving the first transistor in a half-bridge circuit containing the first transistor and a second transistor with which cross currents can be prevented, and of minimizing the delay during which the first and second transistors are blocking at the same time. It would of further advantage to provide a control circuit for a half-bridge circuit for use with such method.

SUMMARY

The inventive method for controlling the first transistor in a half-bridge circuit containing this first transistor and a second transistor entails, during switching off of this second transistor, comparison of the amplitude of the drive voltage of the second transistor with two threshold values. In this method, after expiry of a specified first period after an initial point in time at which the second drive voltage undershoots the first threshold value, a switch-on operation for the first transistor is started. The first threshold value, with which the drive voltage of the second transistor is compared, is set adaptively in accordance with a second period between a second point in time at which the amplitude of the second drive voltage undershoots the second threshold value, and another point in time at which the first transistor changes to a specified initial operating state during the switch-on operation.

The method particularly considers during the step for setting the first threshold value to increase this value if the second period is longer than an initial time threshold, and to reduce the first threshold value if the second period is shorter than a second time threshold. The second time threshold can therefore be shorter than the first time threshold so that the first threshold value does not change for second periods with a duration between the first and second time thresholds. An option is also provided by another embodiment of this method to set the second time threshold identical to the first time threshold.

BRIEF DESCRIPTION OF THE DRAWINGS

Unless otherwise stated, identical reference numbers in the figures indicate the same circuit components and signals with the same meaning.

DESCRIPTION

The following explanation refers to a method for controlling a half-bridge circuit illustrated in FIG. 1. The half-bridge circuit includes a first transistor T1—which is also referred to as the high-side transistor—and a second transistor T2—which is also referred to as the low-side transistor, whose load (drain-source) paths D-S are connected in series between a terminal for a positive supply potential VCC and a terminal for a negative supply or reference potential GND. The first and second transistors in FIG. 1 are realized as MOSFETs.

A node common to the drain-source paths of the MOSFETs T1 and T2 represents an output OUT for the half-bridge circuit. An output voltage Vout can be tapped against the reference potential GND at this output OUT. The two MOSFETs T1 and T2 can be driven by first and second drive voltages Vgs1 and Vgs2 corresponding to the gate-source voltages of the two MOSFETs T1 and T2.

A method is explained below for a transition in the operating state of the half-bridge circuit from a first operating state in which the first MOSFET T1 is blocking and the second MOSFET T2 is conducting to a second operating state in which the first MOSFET T1 is conducting and the second MOSFET T2 is blocking. The explanation below assumes that the two MOSFETs T1 and T2 are controlled according to the first and second control signals S1 and S2. The signals can to a high level—or a switch-off level—corresponding in the example to a low level.

Figure 3:
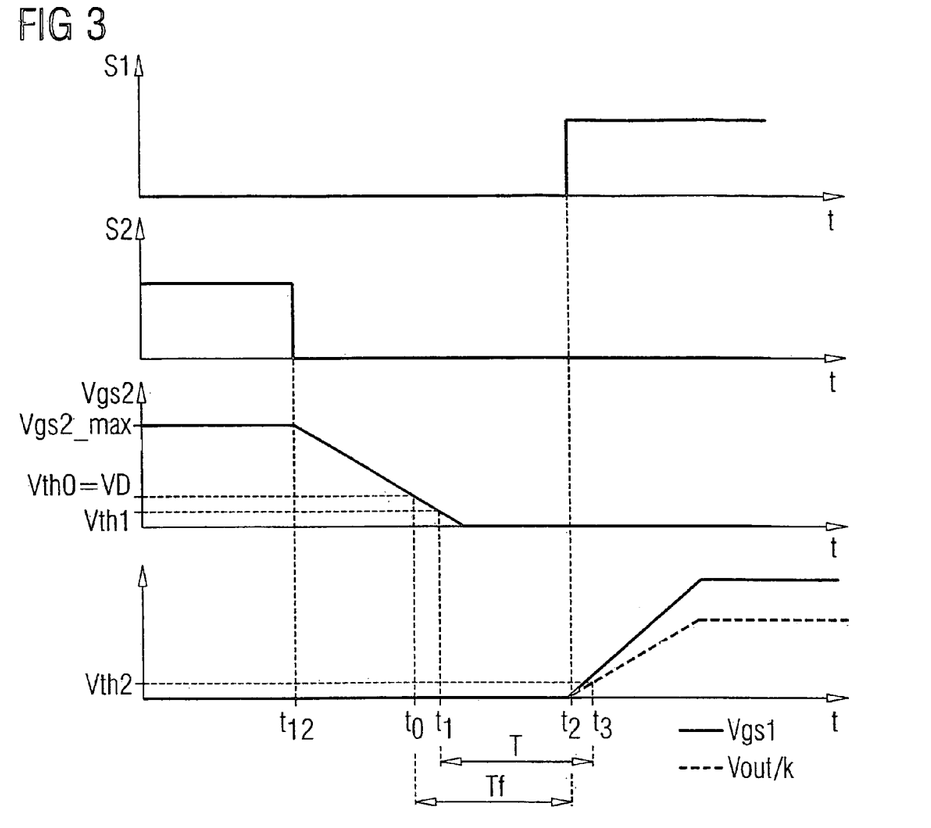
FIG. 3 shows an example of the timing of control signals and drive voltages for the first and second transistors in a half-bridge circuit in an implementation of the method according to the invention, in which a drive voltage of the second transistor is compared with an initial threshold value for an initial momentary value of the first threshold value.

The timing shown in FIG. 3 begins at a time at which the second MOSFET T2 is conducting and the first MOSFET T1 is blocking. The amplitude of the second drive voltage Vgs2 initially has an upper signal level Vgs2_max at which the second MOSFET2 is certain to be conducting. The second control signal S2 has the switch-on level during this period. The first control signal S1 has a switch-off level at the beginning of the timing shown in FIG. 3. The driving voltage Vgs1 of the blocking first transistor T1 is zero in this case.

The switching from the first to the second operating state of the half-bridge circuit begins at a time t12, at which the second control signal S2 adopts a switch-off (low) level. At this time t12 the second MOSFET T2 begins to switch off. The second drive voltage Vgs2 of the second MOSFET T2 sinks during this switch-off operation, starting from the maximum value Vgs2_max. The speed at which the drive voltage Vgs2 falls is dependent on a driver circuit (22 in FIG. 1), that is not described in greater detail and which discharges the gate-source capacitor (Cgs2 in FIG. 1) of the second MOSFET T2 in order to switch it to the blocking state. Please note in this respect that FIG. 3 does not consider special effects arising during the switch-on and switch-off operations—such as the Miller effect—because such effects do not generally influence the basic implementation of the method.

The method involves a comparison during the switch-off operation of the second MOSFET T2—i.e., during falling amplitude of the second drive voltage Vgs2, between this second drive voltage Vgs2 and both a first threshold value Vth0 and a second threshold value Vth1. A first time at which the amplitude of the second drive voltage Vgs2 reaches the first threshold value Vth0 is designated in FIG. 3 as t0. A second time at which the amplitude of the second drive voltage Vgs2 reaches the second threshold value Vth1 is designated in FIG. 3 as t1. This second threshold value Vth1 is lower than the first threshold value Vth0 in the example.

The disclosed method prescribes waiting a defined period Tf after the first time t0, at which the amplitude of the second drive voltage Vgs2 has fallen to the first threshold value Vth0, and upon expiry of this delay Tf to start switching on the first MOSFET T1. FIG. 3 designates a third time t2, which occurs at a time corresponding to the period Tf after the first time t0 expires. The first control signal S1 changes at this third point in time t2 to the switch-on (high) level to start conducting operation of the first MOSFET T1. Starting from this third point in time t2, the amplitude of the first drive voltage Vgs1 rises. The speed at which the amplitude rises is particularly dependent on the characteristics of the first driver circuit (21 in FIG. 1), which charges the gate-source capacitor (Cgs1 in FIG. 1) of the first MOSFET T1 using the first drive voltage Vgs1 with the rising edge of the first control signal S1.

The disclosed method requires that the first threshold value Vth0, which has a first momentary value Vth0=V0 in the example shown in FIG. 3, be adaptively set by means of a number of switching operations, of which only one is illustrated in FIG. 3. The duration between the start of the switch-off operation for the second MOSFET T2 and the start of the switch-on operation for the first MOSFET T1 is optimized in this way without the occurrence of an operating state in which both MOSFETs T1 and T2 are conducting, which would allow a cross current to flow.

In the method, a second period T between the second time t1, at which the amplitude of the second drive voltage Vgs2 undershoots the second threshold value Vth1, and a fourth point in time t3, at which the first MOSFET T1 reaches a defined operating state, is determined. The first threshold value Vth0, which assumes a first momentary value Vth0=VD in the example shown in FIG. 3, is set from switching operation to switching operation in accordance with the delay T.

The second threshold value Vth1 is preferably selected in such a way that it matches or is less than the threshold voltage of the second MOSFET T2. The second time t1 designates the point in time at which the second MOSFET T2 is certain to be blocking. Between the second time t1 and the third time the half-bridge is in an intermediate operating state in which both MOSFETs T1 and T2 are blocking. The specified operating state of the first MOSFET T1, which the MOSFET T1 reaches at the fourth time, is preferably the operating state in which the first MOSFET T1 begins to conduct or is already conducting.

To evaluate the operating state of the first MOSFET T1, its drive voltage Vgs1 can be analyzed—i.e., the drive voltage can be compared with a specified threshold value. A circuit for analysis of this drive voltage Vgs1 is difficult to implement, however, since this drive voltage Vgs1 does not refer to the reference potential GND, but rather to the potential at the output OUT of the half-bridge circuit, which varies with the switching state of the half-bridge circuit.

The evaluation of the operating state of the high-side MOSFET T1 is therefore preferably carried out by analysis of the output voltage Vout. It is assumed in this case that the output voltage Vout approximately follows the first drive voltage Vgs1—i.e., that the output voltage Vout also rises with increasing amplitude of the first drive voltage Vgs1. The output voltage Vout optionally may be divided by a voltage divider in a manner not detailed here into a reduced output voltage value Vout/k. Reduction of the output voltage is merely necessary for further processing the information contained in the output voltage Vout. Such reduction is necessary if a circuit for processing the output voltage would not sustain the output voltage. The characteristic of this reduced output voltage value Vout/k is illustrated by the dashed line in FIG. 3.

The example shown in FIG. 3 assumes that the specified operating state of the first MOSFET T1 applies whenever the reduced divided output voltage has risen to the value of a third threshold value Vth2. The fourth point in time t3 then corresponds to the time at which the divided output voltage Vout/k reaches the third threshold value Vth2.

Figure 4:
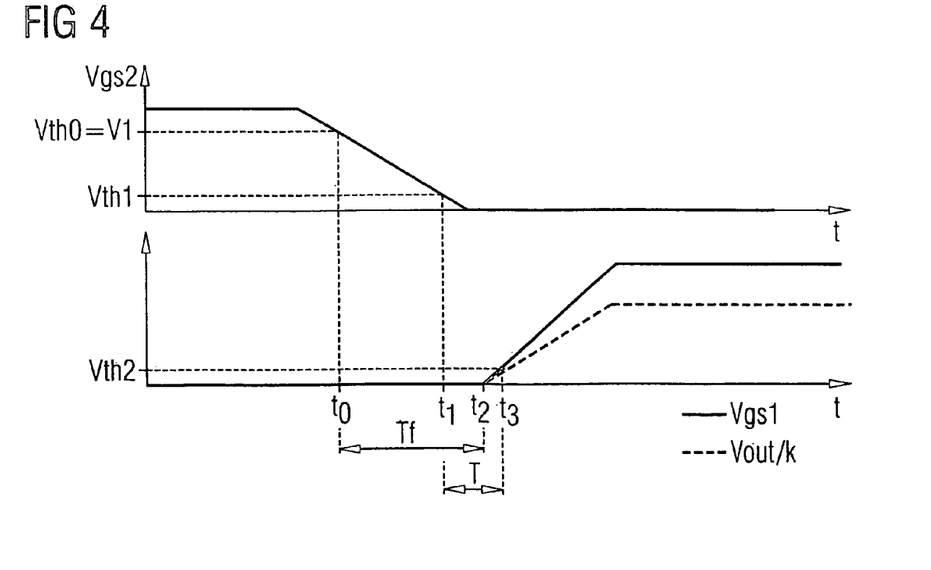
FIG. 4 illustrates the timing of the signals used in FIG. 3 for a second momentary value of the first threshold value.

The first threshold value Vth0 is used in this method to set the second period T. FIG. 4 shows the timing of the first and second drive voltages Vgs1 and Vgs2 and the (reduced) output voltage, respectively, for another momentary value Vth0=V1 of the first threshold value, which is greater than the first momentary value V0 shown in FIG. 3. As can be seen in FIG. 4, the second period T becomes shorter the greater the momentary value of the first threshold becomes.

In the disclosed method, the first threshold value Vth0 may be changed during or after a switching operation in accordance with the second period T determined during the switching in order to set this period T for a subsequent appropriate switching operation for the half-bridge circuit.

The first threshold value Vth0 can be changed from switching operation to switching operation with the same amplitude steps. To do so, the second period T is compared with a specified time threshold value and the first threshold value Vth0 is increased by a specified amplitude value if the second period T is longer than the specified time threshold value. The second period T is therefore regulated in compliance with the value of the specified time threshold. The second period T can be adjusted to the time threshold value more quickly by varying the first threshold value Vth0 according to the difference between the second period T and the specified time threshold. The first threshold value Vth0 is reduced accordingly so as to increase the second period T if this period T is below the specified time threshold.

In order to prevent the first threshold value Vth0 from being changed after every switching action, it is also possible to provide a hysteresis circuit to compare the second period T with a time threshold value. In this case, the second period T is compared with a first and a second time threshold, which differ from each other, and the first threshold value Vth0 is only changed if the second period T is longer than the first time threshold or shorter than the second time threshold. The first threshold value Vth0 is not changed in the case of the second period T having a value between these two time thresholds.

Figure 5:
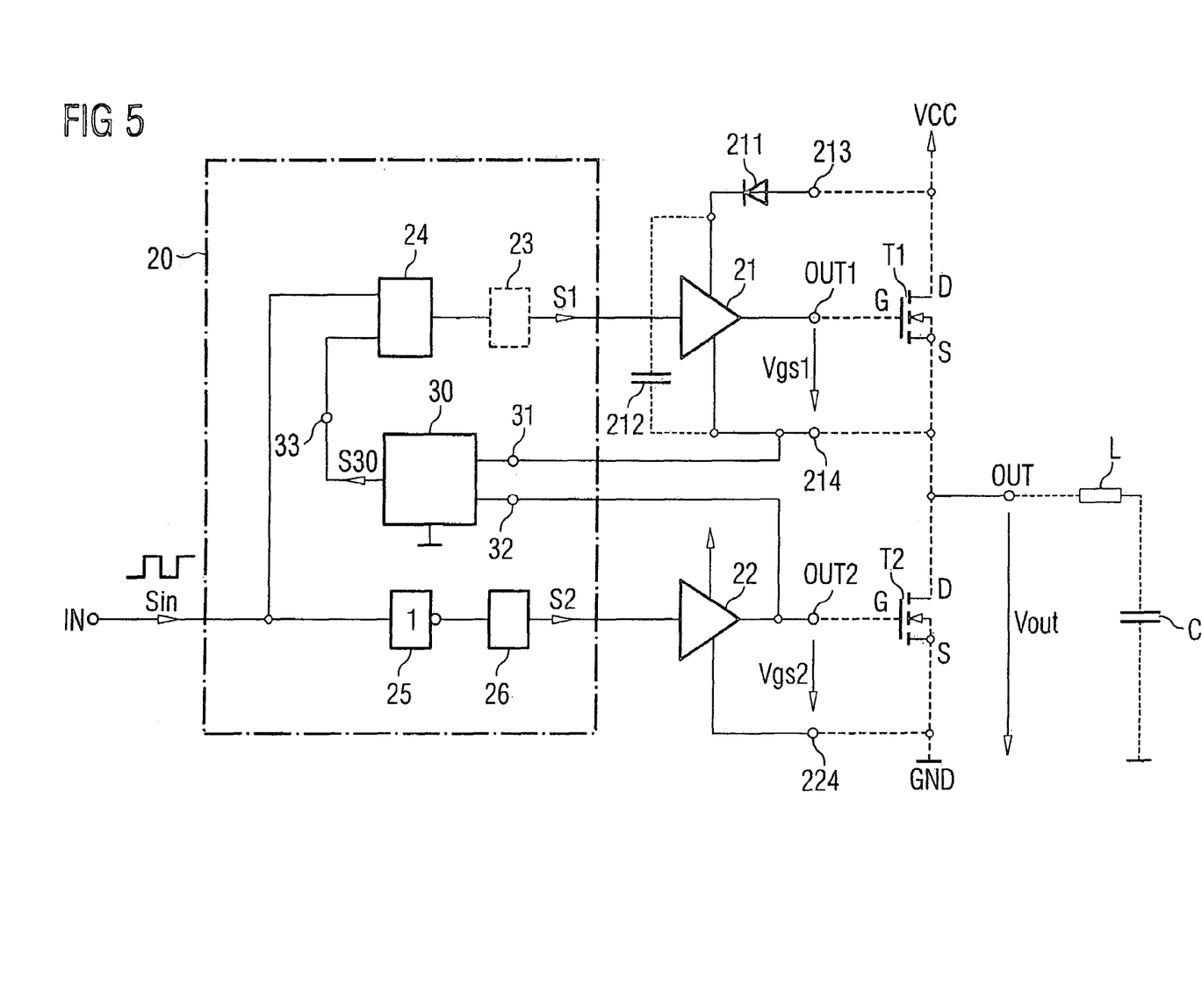
FIG. 5 illustrates an example of an implementation of the control circuit according to the invention comprising an enabling circuit to generate an enabling signal to drive one of the transistors.

An implementation example of a control circuit generating the first and second control signals S1 and S2 for controlling a half-bridge circuit is shown in FIG. 5. For easier comprehension, FIG. 5 also depicts in addition to the control circuit the half-bridge circuit with the two MOSFETs T1 and T2 and the drivers 21 and 22, which convert the control signals S1 and S2 to drive voltages Vgs1 and Vgs2 for the MOSFETs T1 and T2.

The control circuit comprises an input IN for feeding in an input signal Sin. This input signal Sin is, for example, a pulse width-modulated control signal with upper and lower signal levels. It is assumed for the remaining explanation that the first MOSFET T1 is to be set to conducting mode and the second MOSFET T2 to blocking mode for a high level of this input signal Sin, while for a low level of this input signal Sin the low-side MOSFET T2 is conducting and the high-side MOSFET T1 is blocking.

The second control signal S2 for the MOSFET T2 is generated in the example by means of an inverter 25, which inverts the input signal Sin, and an asymmetric delay element 26 connected to the output of the inverter 25. The second control signal S2 is provided at the output of the delay element 26. This asymmetric delay element 26 is designed to transfer rising edges of the signal at its input after a specified delay, but to forward falling edges of the signal at its input without any delay. A rising edge exists at the input of the delay element 26 whenever the input signal Sin exhibits a falling edge—i.e., when the second MOSFET T2 is to be conducting while the first MOSFET T1 is to be blocking in the case of a falling edge of the input signal Sin. The delay in transfer of the rising edge of the signal to the driver 22 is used to ensure that the first MOSFET T1 is blocking before the second MOSFET T2 begins conducting.

The first control signal S1 is provided at the output of a logic gate shown in the example as an AND gate 24, into which the input signal Sin and an enabling signal S30 from the output of an enabling circuit 30 are fed. The first control signal S1 only reaches a switch-on level—i.e., a high level, if the input signal Sin and the enabling signal S30 generated by the enabling circuit 3D, have a high level.

A level shifter 23 is optionally connected between the logic gate 24 and the output of the signal generation circuit or before the input of the first driver 21. The level shift 23 is used to convert the signal at the output of the logic gate 24 into a signal that is suitable for further handling by the driver 21. The driver, which provides a drive voltage Vgs1 referenced to the output potential Vout, must be fed an input signal referenced to the output potential Vout. The first driver 21 can include a well-known bootstrap circuit with a bootstrap capacitor 212 and a bootstrap diode 211, for example, to supply power. The bootstrap diode 211 is connected to the terminal for the supply potential VCC or alternatively, for supply of an inductive load L, to the output terminal OUT.

The enabling circuit 30 has a first input 31, into which the output voltage Vout is fed, and a second input 32, into which the second drive voltage Vgs2 of the second MOSFET T2 is input. The enabling signal S30 at the output of the enabling circuit determines the waiting time to elapse between a change in level of the input signal from a switch-off level to a switch-on level and the actual start of the switching operation of the first MOSFET T1. This switching operation begins when the first control signal S1 changes to a switch-on level.

Figure 6:
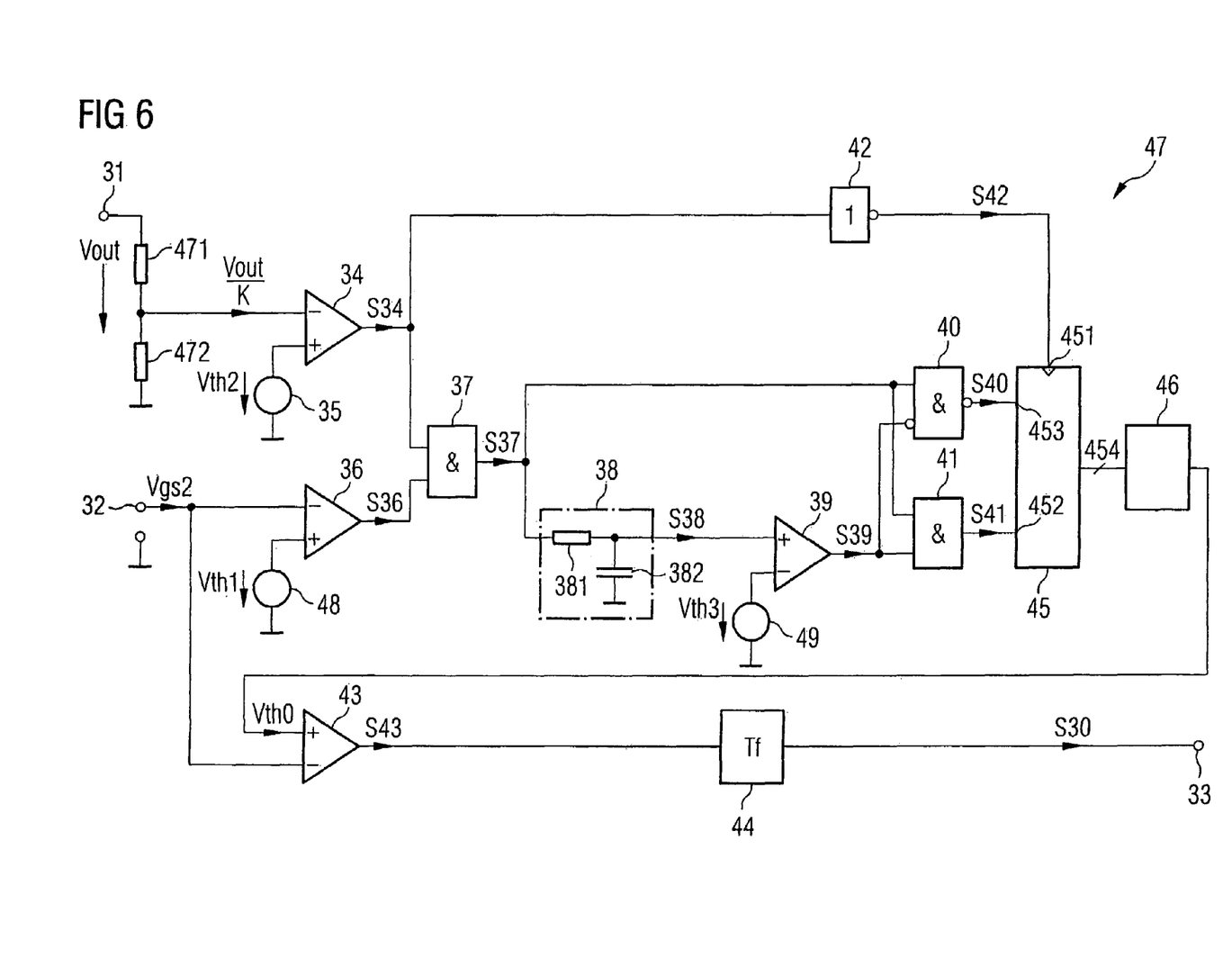
FIG. 6 illustrates an implementation of the enabling circuit.
Figure 7:
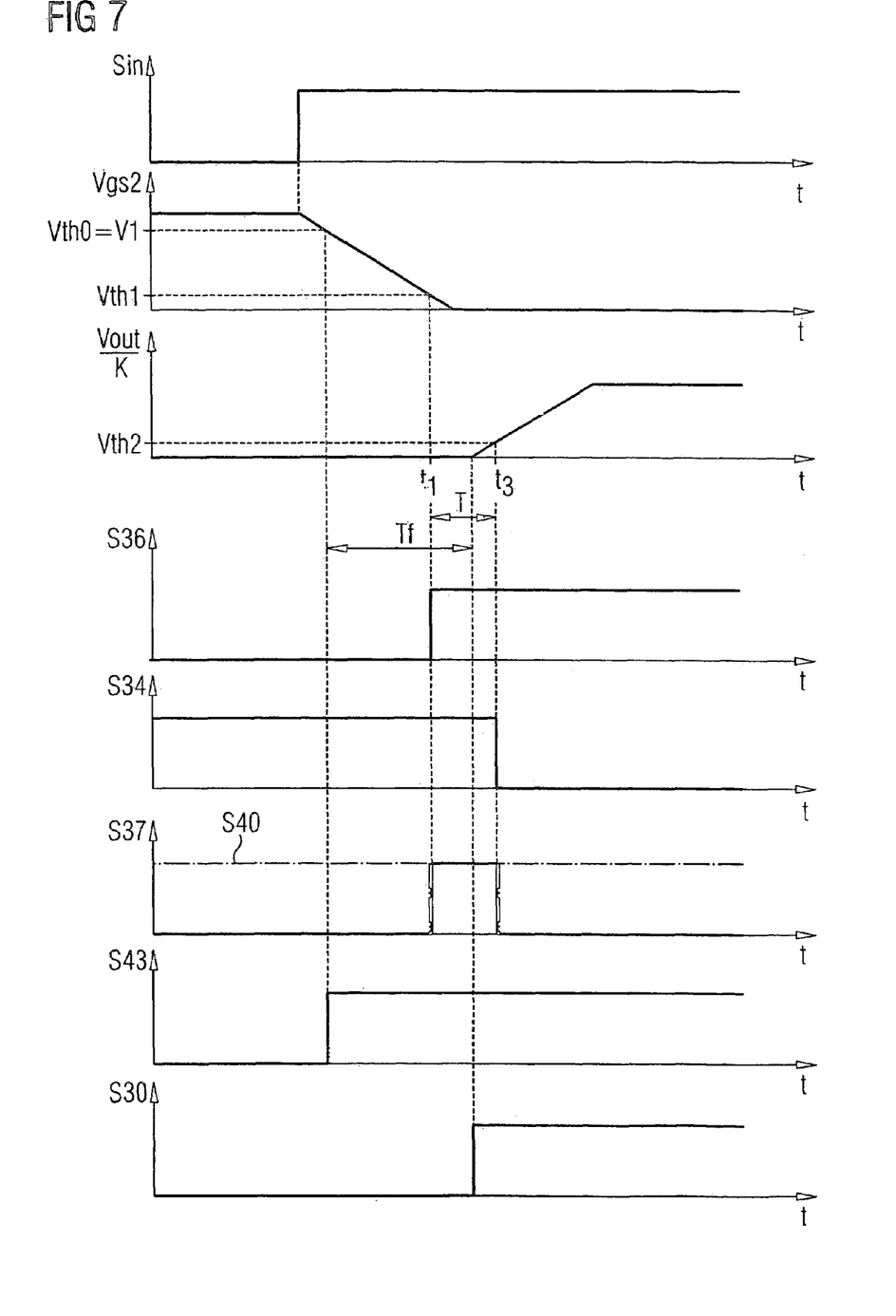
FIG. 7 shows an example of the timing of selected signals appearing in the enabling circuit as shown in FIG. 6.

FIG. 6 displays an example of an implementation of the enabling circuit 30. FIG. 7 shows the timing of some of the signals arising in the enabling circuit for timing of the first and second drive voltages Vgs1 and Vgs2, which are also displayed in FIG. 7.

The enabling circuit 30 comprises a threshold value generating circuit 47 to provide the first threshold value Vth0 and a first comparator 43, into, which the first threshold value Vth0 and the second drive voltage Vgs2 available at the second input 32 are input. The first threshold value Vth0 is applied to the plus input, while the second drive voltage Vgs2 is applied to the minus input of this first comparator 43 so that a comparator output signal S43 from the comparator 43 is at a high level whenever the second drive voltage Vgs2 undershoots the first threshold value Vth0.

The output signal S43 of the first comparator is input into a delay element 44, which forwards a rising edge of the comparator output signal S43 after a fixed delay Tf. The enabling signal S30 is available at the output of this delay element 44. Referring to FIG. 5, a rising edge of the first control signal S1 is therefore generated by means of the logic gate 24 when a rising edge of the enabling signal S30 occurs. Referring to FIGS. 3 and 4, the rising edge of the first control signal S1 designates the start of the switch-on operation for the first transistor T1.

The threshold value generating circuit 47 includes a circuit to generate a pulse width-modulated signal S37, whose pulse duration matches the second period (T in FIGS. 3 and 4). This circuit comprises a second comparator 36, which compares the second drive voltage Vgs2 with the second threshold value Vth1 provided by a reference voltage supply 48. The second drive voltage Vgs2 is fed to the minus input of this second comparator 36, and the second threshold value Vth1 is fed to the plus input of the second comparator 36 in order that an output signal S36 from the comparator has a rising edge whenever the second drive voltage Vgs2 falls below the first threshold value Vth0. FIG. 7 shows the characteristic of this output signal S36 in relation to the second drive voltage Vgs2.

The circuit for generating the pulse width-modulated signal S37 includes a further comparator 34, into which the divided output voltage Vout/k and the third threshold value Vth2 are input. The divided output voltage Vout/k is obtained by a voltage divider with voltage divider resistors 471 and 472. These voltage divider resistors 471 and 472 are connected after the first input 31, at which the output voltage Vout is available. The third threshold value Vth2 is provided by an additional reference voltage source 35. The divided output voltage Vout/k and the third threshold value Vth2 are fed into the third comparator 34 in such a way that an output signal from the comparator 34 has a low level whenever the divided output voltage Vout/k overshoots the third threshold value Vth2. FIG. 7 also shows the timing of this output signal S34 in relation to the divided output voltage Vout/k and the third threshold value Vth2.

The output signals S34 and S36 of these comparators 34 and 36 are input into an AND gate 37, which outputs the pulse width-modulated signal S37. In reference to FIG. 7, this pulse width-modulated signal S37 has a high level between the second time t1, at which the second drive voltage Vgs2 falls below the second threshold value Vth1, and the fourth time t3, at which the divided output voltage Vout/k exceeds the third threshold value Vth2. The duration of any of these signal pulses S37 therefore corresponds to the second period T.

This pulse width-modulated signal S37 is input into an evaluation unit used to analyze the duration of a pulse of the pulse width-modulated signal S37. The evaluation unit includes a low pass filter 38, which is designed in the example as a simple RC element with a resistor 3S1 and a capacitor 3S2, into which the pulse width-modulated signal S37 is input.

Figure 8:
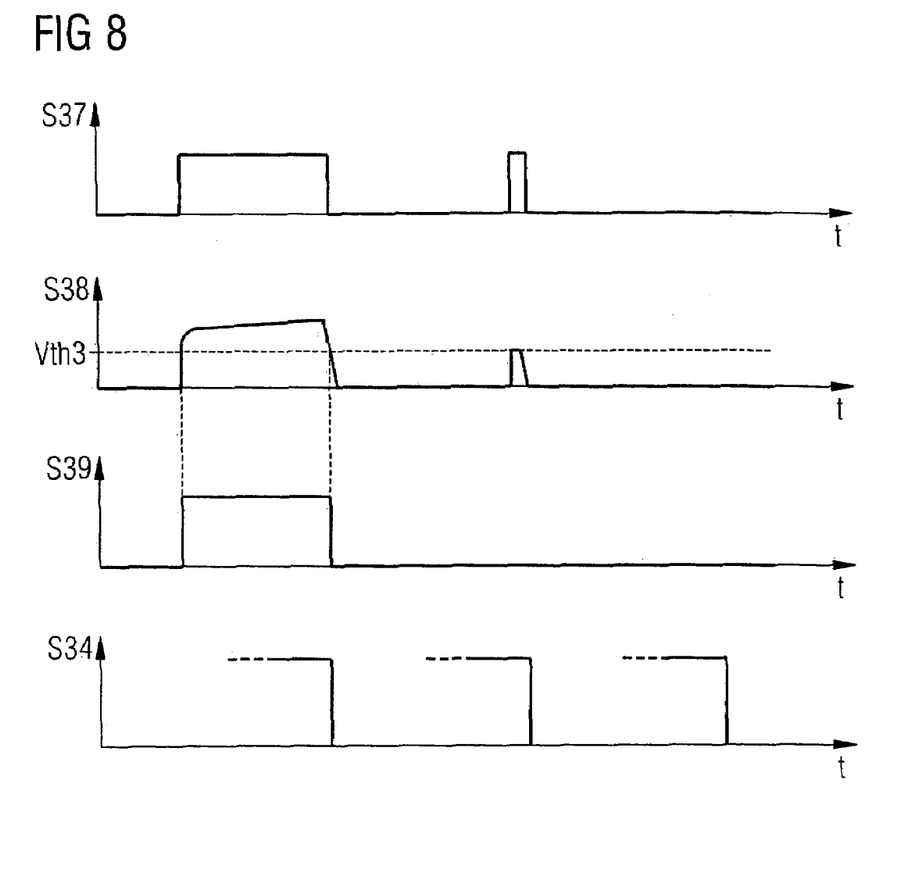
FIG. 8 shows an example of the timing of other signals appearing in the enabling circuit as shown in FIG. 6.

FIG. 8 shows the timing of a low pass-filtered signal S38 at the output of the low pass filter for two pulse width-modulated signal pulses S37 with different lengths. In accordance with the characteristic of a low pass filter of this kind, very short signal pulses are practically suppressed while long signal pulses pass through the filter 38, although the steepness of the signal edges is flattened.

The low pass-filtered signal S38 is compared using a further comparator 39 with a fourth threshold value Vth3 provided by a further reference voltage source 49.

In reference to FIG. 8, a signal pulse is only generated from the low pass-filtered signal S38 using the comparator 39 if the amplitude of the low pass-filtered signal exceeds the fourth threshold value Vth3. The generation of a signal pulse at the output of the additional comparator 39 is therefore dependent on the duration of the pulse width-modulated signal S37—i.e., it is dependent on the second period T. Short signal pulses S37 are practically suppressed by the low pass filter 38—in other words, in the case of short pulses the filter output signal S38 does not exceed the fourth threshold value Vth3 and no signal pulse arises at the output of the additional comparator 39.

The output signal S39 of the additional comparator 39 and the pulse width-modulated signal S37 are input into an AND gate 41; the pulse width-modulated signal S37 is also input into an inverter 40.

The output signals S40 and S41 of the AND gate 40 and inverter 41 are input into a counter 45. The output signal S41 from the AND gate 41 is connected to an incrementing input 452 of the counter 45 and the output signal S40 of the inverter 40 is connected to a decrementing input 453 of the counter 45. The counter 45 also comprises a clock input 451 for input of a clock signal, and is designed to increment or decrement the signals at the inputs in accordance with a rising edge of the clock signal—i.e., to increment or decrement the counter value of the counter.

The current counter value of the counter 45 is connected through an output 452 to a digital/analog converter (DAC) 46, which provides the first threshold value Vth0 at its output. This threshold value Vth0 is therefore directly dependent on the value of the counter 45. The output signal of the third comparator 34 is inverted by an inverter 42 and input as a clock signal into the counter 45. A falling edge of this comparator signal S34, and therefore a rising edge of the clock signal input into the counter 45, occurs in reference to FIG. 7 at the end of the second period T or with a falling edge of the pulse width-modulated signal S37.

The counter 45 is designed to increment its counter value whenever a high level exists at the increment input 452 and a low level at the decrement input 453 at the time a falling edge of the clock signal S42 occurs. Referring to FIG. 8, the counter 45 is incremented when a falling edge of the comparator signal S34 occurs if both the pulse width-modulated signal S37 and the output signal S39 of the additional comparator have a high level. A high level at the output of the comparator 39 only occurs if the pulse width-modulated signal S37 is long enough not to be significantly suppressed by the low pass filter 38.

If the pulse width-modulated signal S37 has a high level at the time a falling edge of the comparator signal S39 occurs, but if the comparator signal S39 has a low level—which means that a pulse of the pulse width-modulated signal S37 is so short that it will be suppressed by the filter—the counter value remains unchanged because there is no high level at either of the inputs 452 and 453 of the counter during the falling edge of the clock signal S42.

If the pulse width-modulated signal S37 has a low level when a falling edge of the comparator signal S34 occurs, the value of the counter 45 is reduced by means of the signal S40. The latter case, in which the duration of the pulse width-modulated signal S37 is zero, occurs (referring to FIGS. 3, 4 and 7) if the first threshold value Vth0 is so large that the specified period Tf expires even before the second drive voltage Vgs2 falls to the value of the second threshold value Vth1. In this case, the first threshold value Vth0 must be reduced in order to lengthen the time between the switch-off operation of the second MOSFET T2 and the switch-on operation of the first MOSFET T1.

The levels of the signals S40 and S41, which are used as input signals for the counter, vary with the signal S34, which is used via the inverter 42 as a clock signal for the counter 45. To prevent the levels of the input signals of the counter from changing directly whenever the signal S34 changes level, and to ensure that the levels of the input signals of the counter 45 are applied for a sufficiently long period of time to activate a counting action if necessary, an option exists for connecting delay elements with a short delay between the AND gate 41 and the counter 45, and between the inverter 40 and the counter 45. This option is not detailed any further.

In the threshold value generation circuit shown in FIG. 6, the threshold value Vth0 is adjusted in such a way that the duration of a pulse of the pulse width-modulated signal S37 is longer than zero but nonetheless so short that the corresponding pulse is suppressed by the low pass filter 38 so that its maximum amplitude remains below the fourth threshold value Vth3. The controlling behavior of this circuit therefore depends mainly on the low pass filter or the limit frequency of the filter. The longer the pulses that are not significantly suppressed by the low pass filter 38, the longer the second period T for the system to adjust itself.

The second and third comparators 34 and 36 together with the AND gate in the displayed enabling circuit constitute a pulse width modulator that provides a pulse width-modulated signal. The duration of individual pulses of the pulse width-modulated signal depends on a comparison of the divided output voltage Vout/k and the second drive voltage Vgs2 with the second and third threshold values.

The low pass filter 38, the additional comparator 39 and the two logic gates 40 and 41 form an evaluation circuit that analyzes the duration of a pulse of the pulse width-modulated signal S37 and increments or decrements the counter or leaves it unchanged according to that duration. The counter 45 is incremented if the duration if this duration is longer than an initial threshold value, and decremented if the duration is shorter than a second threshold value or if this second threshold value is reached. The second threshold time is zero in the previously explained example.

The previous explanation assumes for the analysis of the operating state of the first and second transistors T1 and T2 that the drive voltages Vgs1 and Vgs2 of the transistors are used or that the output voltage Vout for the second transistor is used. These signals fulfill the function of operating state signals and can be substituted by other suitable signals, for example, the load path voltages of the transistors.

There are various alternatives for the selection of the initial value of the counter 45 as described below.

On the one hand, the initial value of the counter can be chosen to be very small—for example, so small that the threshold value Vth0 at the beginning of the operation approximately matches the second threshold value Vth1. In reference to FIG. 3, very long second periods T are obtained in this way, meaning that the value of the counter 45 is increased from switching operation to switching operation in order to increase the first threshold value Vth0 and therefore adjust the second period T to a value defined by the pass characteristics of the low pass filter 38.

It is also possible to choose a very large initial value for the counter 45, with the result that the period between switching off of the second MOSFET T2 and switching on of the first MOSFET T1 is very short. At the beginning of the operation, cross current could flow, which is then reduced from switching operation to switching operation when the first threshold value Vth0 is reduced from switching operation to switching operation.

In the control signal generation circuit 20 shown in FIG. 5 the method claimed in the invention is implemented only for generation of the control signal S1 for the first MOSFET T1. The control circuit can however be easily extended so that the method claimed in the invention is implemented both for control of the first and second MOSFETs T1 and T2 by connecting an AND gate corresponding to the AND gate 24 to the output of the inverter 5 and by including an enabling circuit corresponding to the enabling circuit 30 to generate an enabling signal for control of the second MOSFET T2.

The method according to the present invention has been described for driving the high-side MOSFET in a half-bridge circuit. The method according to the invention and the drive circuit of course, is also applicable to driving the low-side MOSFET T2. In this case, the output voltage Vout (or the divided output voltage Vout/k) is to be compared with the first threshold value Vth0 and the second threshold value Vth1 when switching off the high-side MOSFET T1, and a switch-on operation of the low-side MOSFET T2 starts after fixed Tf has elapsed. Instead of comparing the output voltage Vout with the first and second thresholds Vth0, Vth1 of course, the gate-source voltage Vgs1 of high-side MOSFET T1 could be compared with these thresholds.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method of controlling a circuit comprising:
   providing a first transistor connected to a second transistor, wherein the first transistor and second transistor each include a control input;
   switching off the second transistor and comparing a drive characteristic at the control input of the second transistor with a first threshold value and a second threshold value;
   switching on the first transistor following a first time period, wherein the first time period begins when the drive characteristic at the control input of the second transistor is equal to the first threshold value; and
   determining the first threshold value based on a second time period.

2. The method of claim 1 wherein the second time period is a predetermined time period.

3. The method of claim 2 wherein the second time period begins when the drive characteristic at the control input of the second transistor is equal to the second threshold value, and wherein the second time period ends when the first transistor is in a specified initial operating state.

4. The method of claim 3 wherein the first transistor is in the specified initial operating state when a drive characteristic at the control input of the first transistor is equal to a specified third threshold value.

5. The method of claim 1 wherein a load path of the first transistor connected in series with a load path of the second transistor.

6. The method of claim 1 wherein the drive characteristic at the control input of the second transistor is a drive voltage.

7. A method for controlling a first transistor and a second transistor, wherein the first transistor and the second transistor each comprise a load path and a control gate, wherein the load path of the first transistor is connected in series with the load path of the second transistor, and wherein the first transistor can be controlled by applying a first drive voltage to the control gate of the first transistor and the second transistor can be controlled by applying a second drive voltage to the control gate of the second transistor, the method comprising:
   during a switch-off operation of the second transistor, comparing the amplitude of the second drive voltage with a first threshold value and a second threshold value;
   starting a switch-on operation for the first transistor following a specified first period, wherein the specified first period begins at a first time, wherein the first time is when the second drive voltage undershoots the first threshold value; and
   setting the first threshold value in accordance with a second period, wherein the second period begins at a second time and ends at an end time, wherein the second time is when the amplitude of the second drive voltage undershoots the second threshold value, and wherein the end time is when the first transistor adopts a specified initial operating state during the switch-on operation.

8. The method of claim 7 wherein an output is provided at a node common to the load path of the first transistor and the load path of the second transistor, and wherein an operating state of the first transistor is determined by analyzing an output voltage available at the output.

9. The method of claim 8 wherein the specified initial operating state of the first transistor exists if an amplitude of the output voltage exceeds a specified third threshold value.

10. The method of claim 7 wherein, during the step of setting the first threshold value, the first threshold value is increased if the second period is longer than a first time threshold, and the first threshold value is decreased if the second period is shorter than a second time threshold.

11. The method of claim 10 wherein the second time threshold is shorter than the first time threshold.

12. The method of claim 10 wherein the second time threshold is identical to the first time threshold.

13. The method of claim 7 wherein a signal pulse is generated with a duration matching the second period, wherein the signal pulse is filtered by a low pass filter in order to generate a low pass-filtered signal pulse, and wherein the low pass-filtered signal pulse is used to set the first threshold value.

14. The method of claim 7 wherein the first transistor and the second transistor are MOSFET transistors and wherein the second threshold value at least approximately matches the activation voltage of the second transistor.

15. A control circuit configured to generate a control signal for a first transistor in a half-bridge circuit comprising the first transistor and a second transistor, the control circuit comprising:
    a first input configured to receive a first operating state signal for the first transistor;
    a second input configured to receive a second operating state signal for the second transistor;
    a first comparator configured to compare the second operating state signal with a first threshold value and provide an enabling signal intended to enable the generation of a switch-on level of the control signal following a time delay; and
    a threshold value generating circuit configured receive the first operating state signal and the second operating state signal and generate the first threshold value.

16. The control circuit of claim 15 further comprising a delay element connected to the first comparator, wherein the delay element is configured to output the enabling signal following a specified delay time.

17. The control circuit of claim 15 wherein the control circuit further comprises
    a pulse width modulator configured to generate a pulse width-modulated signal, wherein a pulse length of the pulse width modulated signal depends on a comparison of the second operating state signal with a second specified threshold value and on a comparison of the first operating state signal with a specified third threshold value;
    a counter including an increment input, a decrement input and an output;
    a digital/analog converter connected to the output of the counter and configured to provide the first threshold value; and
    an evaluation circuit, wherein the pulse width-modulated signal is input into the evaluation circuit, the evaluation circuit configured to analyze the duration of a pulse of the pulse width-modulated signal and to generate control signals for the decrement input and increment input of the counter in accordance with the duration of the pulse.

18. The control circuit of claim 17 wherein the pulse width modulator is configured to generate the pulse width-modulated signal in such a way that the pulse begins at a time at which the second operating state signal falls below the second threshold value, and in such a way that the pulse ends at a time at which the first operating state signal rises above the third threshold value.

19. The control circuit of claim 17 wherein the evaluation circuit is designed to increment a count value of the counter whenever the duration of the pulse is longer than a first threshold time, and to decrement the count value whenever the duration of the pulse is shorter than a second threshold time.

20. The control circuit of claim 17 wherein the evaluation circuit comprises
- a low pass filter wherein the pulse width-modulated signal is input into the low pass filter,
- a second comparator connected to the low pass filter, the second comparator configured to compare an output signal of the low pass filter with an additional threshold value; and
- a logic circuit, wherein an output signal of the second comparator and the pulse width-modulated signal are input into the logic circuit, and wherein the logic circuit is configured to generates the control signals for the decrement input and increment input of the counter.

21. The control circuit of claim 15 wherein the first operating state signal is a signal dependent on an output voltage of the half-bridge circuit, and wherein the second operating state signal is a drive voltage of the second transistor.

* * * * *